(12) United States Patent
Lim et al.

(10) Patent No.: US 12,740,451 B2
(45) Date of Patent: Sep. 15, 2026

(54) SEMICONDUCTOR PACKAGES INCLUDING AUXILIARY CONDUCTOR COUPLED TO TRACE PATTERN

(71) Applicant: SK hynix Inc., Icheon-si (KR)

(72) Inventors: Sung Mook Lim, Icheon-si (KR); Jong Wook Kim, Icheon-si (KR); Ju Il Eom, Icheon-si (KR); Chang Shik Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 357 days.

(21) Appl. No.: 18/535,789

(22) Filed: Dec. 11, 2023

(65) Prior Publication Data

US 2024/0379523 A1 Nov. 14, 2024

(30) Foreign Application Priority Data

May 8, 2023 (KR) ........................ 10-2023-0059449

(51) Int. Cl.
*H10W 70/65* (2026.01)
*H10W 90/00* (2026.01)

(52) U.S. Cl.
CPC ......... *H10W 70/65* (2026.01); *H10W 90/701* (2026.01); *H10W 90/724* (2026.01); *H10W 90/754* (2026.01)

(58) Field of Classification Search
CPC . H10W 70/65; H10W 90/701; H10W 90/724; H10W 90/754
USPC ........................................................ 257/668
See application file for complete search history.

(56) References Cited

U.S. PATENT DOCUMENTS

| | | | | |
|---|---|---|---|---|
| 6,646,343 | B1 | 11/2003 | Sharma et al. | |
| 2007/0241447 | A1* | 10/2007 | Cheung ................ | H10W 72/00 257/E23.079 |
| 2017/0162515 | A1* | 6/2017 | Kim ...................... | H10W 42/20 |
| 2020/0075501 | A1* | 3/2020 | Raorane ................ | H10W 42/20 |

* cited by examiner

*Primary Examiner* — Phuc T Dang
(74) *Attorney, Agent, or Firm* — WILLIAM PARK AND ASSOCIATES LTD.

(57) ABSTRACT

A semiconductor package in which an auxiliary conductor is coupled to a trace pattern is presented. The semiconductor package includes a semiconductor die disposed over a package substrate including a trace pattern. The semiconductor package includes a first auxiliary conductor having a first end and a second end coupled to the trace pattern.

20 Claims, 10 Drawing Sheets

10
100
110
110T
110B
120
121
122
123
124
125
130
131
132
133
140
160
170
200
200P
300
400
401
402
403
500

122-1
400-2
125-1
402-1
123-1
126-1
403-1
400-1
401-1
124-1
121-1
120-1
120-2
110T-1/110-1
(110T/110)

SEMICONDUCTOR PACKAGES INCLUDING AUXILIARY CONDUCTOR COUPLED TO TRACE PATTERN

CROSS-REFERENCE TO RELATED APPLICATIONS

The present application claims priority under 35 U.S.C. § 119(a) to Korean Application No. 10-2023-0059449, filed in the Korean Intellectual Property Office on May 8, 2023, which is incorporated herein by reference in its entirety.

BACKGROUND

1. Technical Field

The present disclosure generally relates to a packaging technology and, more particularly, to semiconductor packages including an auxiliary conductor coupled to a trace pattern.

2. Related Art

A semiconductor package may include a semiconductor die mounted on a package substrate. The package substrate may include trace patterns connected to the semiconductor die that provide transmission paths of signals. As the operating speed of the semiconductor die increases, improvement in signal transmission speed through the trace patterns may be required. Attempts have been made to improve the signal transmission speed by adjusting the arrangement of the trace patterns.

SUMMARY

The present disclosure according to an aspect may present a semiconductor package including a package substrate including a trace pattern, a semiconductor die disposed over the package substrate, and a first auxiliary conductor including a first end portion and a second end portion coupled to the trace pattern.

The present disclosure according to an aspect may present a semiconductor package including a package substrate including a trace pattern, a semiconductor die disposed over the package substrate, and a first auxiliary conductor coupled to the trace pattern. The trace pattern may include a first bending portion and a second bending portion mirroring each other along an axis. The first auxiliary conductor may include a first end portion and a second end portion respectively coupled to the first bending portion and the second bending portion.

The present disclosure according to an aspect may present a semiconductor package including a package substrate including a trace pattern having bent portions, a semiconductor die disposed over the package substrate, and a first auxiliary conductor connected to the trace pattern. The first auxiliary conductor bypasses portions of the trace pattern.

DETAILED DESCRIPTION

Figure 1:
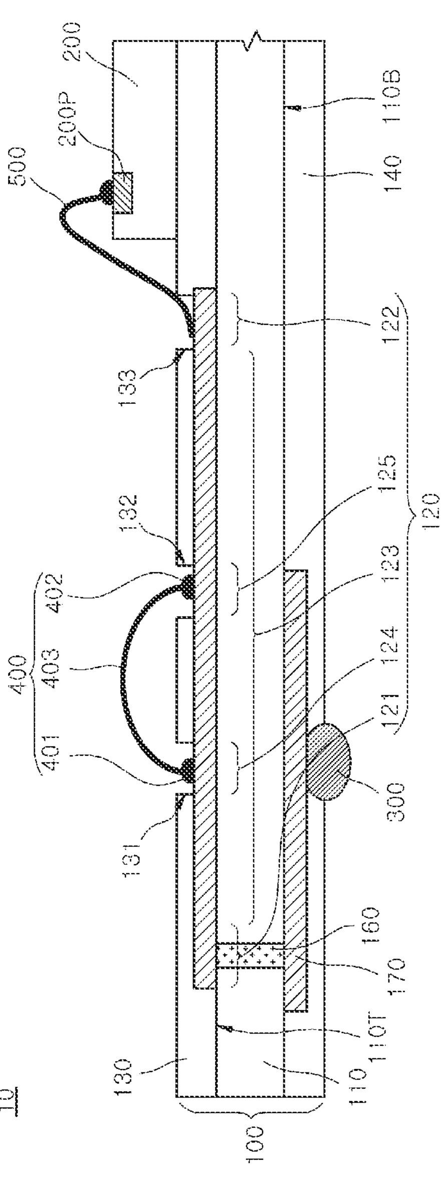
FIG. 1 is a view illustrating a semiconductor package according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

In the description of the present disclosure, descriptions such as "first" and "second," "side," "top," and "bottom or lower" are for distinguishing elements, and are not used to limit the elements themselves or to imply a specific order.

A semiconductor package may include a semiconductor die (or semiconductor chip). A semiconductor package may include a structure in which a plurality of semiconductor dies are stacked. A semiconductor die may include integrated circuits. A semiconductor die may be parted from a semiconductor substrate or wafer.

A semiconductor chip may be a memory chip in which memory devices, such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated. The semiconductor chip may indicate a logic die or an ASIC chip in which logic circuits are integrated in a semiconductor substrate, or a processor, such as an application processor (AP), a graphic processing unit (GPU), a central processing unit (CPU), or a system-on-chip (SoC).

The semiconductor chip may be employed in information communication systems, such as mobile phones, electronic systems associated with biotechnology or health care, or wearable electronic systems. The semiconductor chip may be applicable to internet of things (IoT).

Same reference numerals refer to same elements throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIG. 1 is a view illustrating a semiconductor package 10 according to an embodiment of the present disclosure.

Referring to FIG. 1, the semiconductor package 10 may include a semiconductor die 200 disposed on a package substrate 100. The semiconductor die 200 may be an electronic component on which integrated circuits are integrated. The integrated circuits may constitute a memory device. The package substrate 100 may be an interconnection structure connected to the semiconductor die 200. The package substrate 100 may be configured in the form of a printed circuit board (PCB). The package substrate 100 may be configured in the form of an interposer or in a structure including dielectric layers and conductive patterns.

The package substrate 100 may include a conductive trace pattern 120. The conductive trace pattern 120 may be an interconnection element electrically or signally connected to the semiconductor die 200. The package substrate 100 may include a substrate body 110, and the conductive trace pattern 120 may be disposed on a top surface 110T of the substrate body 110. The substrate body 110 may include a dielectric material. Although not illustrated, the substrate body 110 may include a structure in which a plurality of dielectric material layers are stacked and a plurality of conductive patterns are disposed between the dielectric material layers.

The package substrate 100 may further include a conductive pattern 170 in order to arrange a conductive ball to be formed on a bottom surface 110B, which is on the opposite side of the top surface 110T of the substrate body 110. An outer connector 300, such as a solder ball, may be connected to the conductive pattern 170. The package substrate 100 may further include a conductive via 160 connecting the conductive pattern 170 to the conductive trace pattern 120. The conductive via 160 may be formed as a conductor that substantially penetrates the substrate body 110. The package substrate 100 may further include a first dielectric layer 130 that covers the top surface 110T of the substrate body 110 to protect the conductive trace pattern 120. The package substrate 100 may further include a second dielectric layer 140 that exposes the conductive pattern 170 while covering the bottom surface 110B of the substrate body 110. Each of the first dielectric layer 130 and the second dielectric layer 140 may include a solder resist layer.

The conductive trace pattern 120 may be a linear pattern that includes a second extended portion 123 including a first coupling portion 124 and a second coupling portion 125 and includes a third end portion 122 and a fourth end portion 121 connected to the second extended portion 123. The second extended portion 123 of the conductive trace pattern 120 may be a middle portion connecting the third end portion 122 with the fourth end portion 121.

The third end portion of the conductive trace pattern 120 may be electrically connected to the semiconductor die 200. The semiconductor package 10 may further include a connecting bonding wire 500 that connects the third end portion 122 of the conductive trace pattern 120 with the semiconductor die 200. The connecting bonding wire 500 may be connected to a conductive pad 200P of the semiconductor die 200. The conductive via 160 of the package substrate 100 may be connected to the fourth end portion 121 of the conductive trace pattern 120. The conductive trace pattern 120 may be an interconnection that electrically connects the conductive via 160 with the bonding wire 500.

The first dielectric layer 130 may be a layer that covers the top surface 110T of the substrate body 110 and the conductive trace pattern 120. The first dielectric layer 130 may include openings 131, 132, and 133 exposing portions of the conductive trace pattern 120. The first opening 131 of the first dielectric layer 130 may be formed to expose the first coupling portion 124 of the conductive trace pattern 120. The second opening 132 of the first dielectric layer 130 may be formed to expose the second coupling portion 125 of the conductive trace pattern 120. The third opening 133 of the first dielectric layer 130 may be formed to expose the third end portion 122 of the conductive trace pattern 120.

The semiconductor package 10 may further include a first auxiliary conductor 400 connected to the conductive trace pattern 120. The first auxiliary conductor 400 may be a linear element that includes a first end portion 401 and a second end portion 402 on both sides of the first auxiliary conductor 400 and includes a first extended portion 403 connecting the first end portion 401 with the second end portion 402. The first auxiliary conductor 400 may include a bonding wire. The first end portion 401 of the first auxiliary conductor 400 may be coupled or bonded to the first coupling portion 124 of the conductive trace pattern 120. The first auxiliary conductor 400 may be extended to pass through the first opening 131 of the first dielectric layer 130 so that the first end portion 401 may be bonded to the first coupling portion 124 of the conductive trace pattern 120. The second end portion 402 of the first auxiliary conductor 400 may be coupled or bonded to the second coupling portion 125 of the conductive trace pattern 120. The first auxiliary conductor 400 may be extended to pass through the second opening 132 of the first dielectric layer 130 so that the second end portion 402 may be bonded to the second coupling portion 125 of the conductive trace pattern 120. The first coupling portion 124 and the second coupling portion 125 of the conductive trace pattern 120 may be portions of the conductive trace pattern 120 that are positioned to be spaced apart from each other. Although the first end portion 401 and the second end portion 402 may be formed on the conductive trace pattern 120, the first extended portion 403 of the first auxiliary conductor 400 may be spaced apart from the conductive trace pattern 120.

The structure in which the first auxiliary conductor 400 is coupled to the conductive trace pattern 120 may improve the transmission speed of a signal transmitted through the conductive trace pattern 120. The transmission speed of the signal may be improved as the time delay is reduced. The time delay may be obtained as the square root of a value obtained by multiplying the inductance and capacitance of the transmission path. Compared to the conductive trace pattern 120 without the first auxiliary conductor 400, the structure having the first auxiliary conductor 400 may increase conductance and capacitance while reducing the resistance and inductance of a signal transmission path. The decrease in inductance may be greater than the increase in capacitance, thereby reducing the time delay. Since inductance may be reduced and capacitance may be increased, the impedance of the signal transmission path may be reduced.

Referring back to FIG. 1, although the case in which one semiconductor die 200 in the semiconductor package 10 is mounted on the package substrate 100 has been described as an embodiment, a plurality of semiconductor dies 200 may be stacked. Although not illustrated, the semiconductor package 10 may further include an encapsulant layer covering the package substrate 100 and encapsulating the semiconductor die 200.

Figure 2:
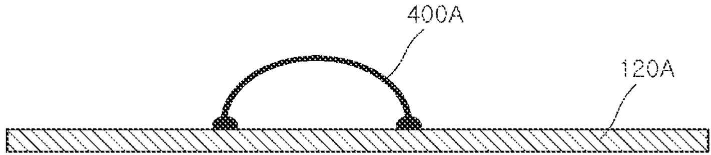
FIGS. 2 to 5 are plan views illustrating embodiments in which a conductive trace pattern and an auxiliary conductor of the semiconductor package of FIG. 1 are arranged.

FIG. 2 is a view illustrating a shape in which a conductive trace pattern 120A and a first auxiliary conductor 400A of the semiconductor package (10 in FIG. 1) are disposed according to an embodiment. The conductive trace pattern 120A may be a straight line pattern, and one first auxiliary conductor 400A may be coupled to the conductive trace pattern 120A.

Figure 3:
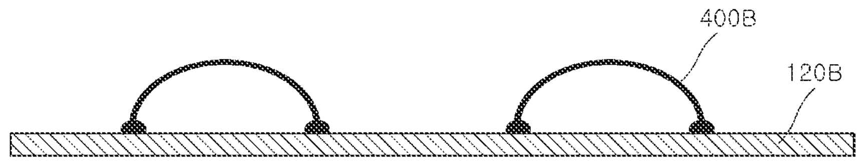

FIG. 3 is a view illustrating a shape in which a conductive trace pattern 120B and a plurality of first auxiliary conductors 400B of the semiconductor package (10 in FIG. 1) are disposed according to an embodiment. The plurality of first auxiliary conductors 400B may be coupled to one conductive trace pattern 120B. Although two first auxiliary conductors 400B are depicted in FIG. 3, three or more first auxiliary conductors 400B may be coupled to one conductive trace pattern 120B.

Figure 4:
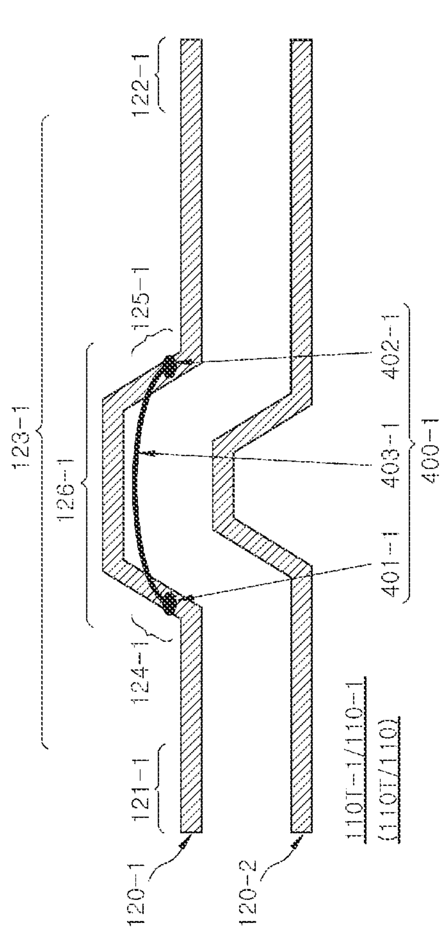

FIG. 4 is a plan view illustrating the arrangement of conductive trace patterns 120-1 and 120-2 and a first auxiliary conductor 400-1 of the semiconductor package (10 in FIG. 1) according to an embodiment.

Referring to FIG. 4, the first conductive trace pattern 120-1 and the second conductive trace pattern 120-2 may be disposed on a top surface 110T-1 of a substrate body 110-1 of the package substrate (100 of FIG. 1) to be spaced apart from each other. Although FIG. 4 shows only the arrangement of the first conductive trace pattern 120-1 and the second conductive trace pattern 120-2, additional conductive trace patterns may be further disposed on the top surface 110T-1 of the substrate body 100-1.

The first conductive trace pattern 120-1 may include a third end portion 122-1 and a fourth end portion 121-1, opposite to the third end portion 122-1, and may include a second extended portion 123-1 connecting the third end portion 122-1 with the fourth end portion 121-1. A portion of the second extended portion 123-1 may include a bending portion 126-1. The bending portion 126-1 may include a portion bent so that the first conductive trace pattern 120-1 deviates from being a straight line. The bending portion 126-1 may include a first bending portion 124-1 and a second bending portion 125-1. The first bending portion 124-1 and the second bending portion 125-1 may be disposed to face each other. The first bending portion 124-1 and the second bending portion 125-1 may be positioned to mirror each other along a vertical axis between the first bending portion 124-1 and the second bending portion 125-1 (vertical in relation to the position of FIG. 4). The first bending portion 124-1 may be a portion formed by bending a portion of the second extension portion 123-1 extending from the fourth end portion 121-1. The second bending portion 125-1 may be a portion formed by bending another portion of the second extension portion 123-1 extending from the third end portion 122-1.

A first end portion 401-1 of the first auxiliary conductor 400-1 may be coupled to the first bending portion 124-1 of the first conductive trace pattern 120-1, and a second end portion 402-1 of the first auxiliary conductor 400-1 may be coupled to the second bending portion 125-1 of the first conductive trace pattern 120-1. A first extended portion 403-1 of the first auxiliary conductor 400-1 may connect the first end portion 401-1 with the second end portion 401-2. A portion of the first conductive trace pattern 120-1 between the first bending portion 124-1 and the second bending portion 125-1 and the first extended portion 403-1 of the first auxiliary conductor 400-1 might not overlap. A length of the first extended portion 403-1 may be shorter than a length of the first conductive trace pattern 120-1 connecting the first bending portion 124-1 and the second bending portion 125-1. Accordingly, the first extended portion 403-1 may provide a shortcut connecting the first bending portion 124-1 with the second bending portion 125-1. The first auxiliary conductor 400-1 may bypass portions of the first conductive trace pattern 120-1.

In a semiconductor package, a trace pattern may include a plurality of bending portions. In the process of transmitting a high-speed signal through the trace pattern, the signal may be delayed due to the bending portions of the trace pattern. According to the embodiment of the present disclosure, since the structure in which the first auxiliary conductor 400-1 is coupled to the first conductive trace pattern 120-1 bypasses portions of the first conductive trace pattern 120-1 and provides a shortcut for signal transmission, the time delay may be reduced.

Figure 5:
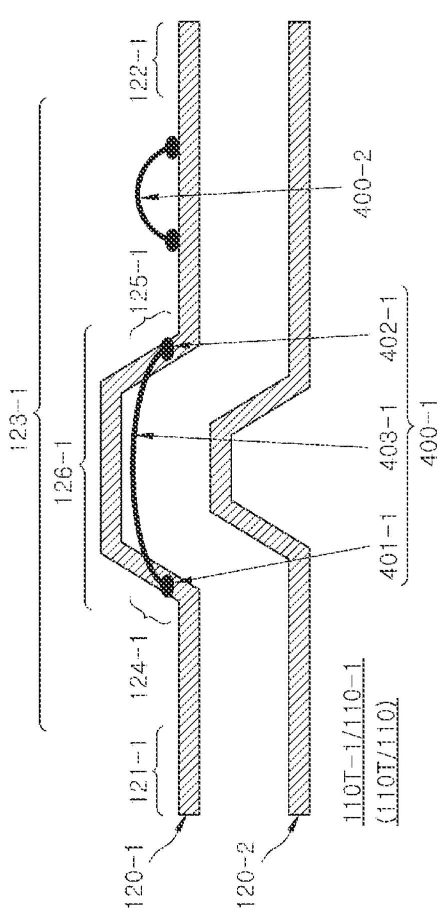

FIG. 5 is a plan view illustrating the arrangement of conductive trace patterns 120-1 and 120-2 and auxiliary conductors 400-1 and 400-2 of the semiconductor package 10 of FIG. 1. In FIG. 5, the same reference numerals as in FIG. 4 may indicate the same elements.

Referring to FIG. 5, the first conductive trace pattern 120-1 may be disposed on the top surface 110T-1 of the substrate body 110-1 of the package substrate (100 of FIG. 1), and the first auxiliary conductor 400-1 and the second auxiliary conductor 400-2 may be coupled to the first conductive trace pattern 120-1. The second auxiliary conductor 400-2 may be disposed at a location spaced apart from the first auxiliary conductor 400-1. The second auxiliary conductor 400-2 may include a bonding wire. The structure in which the first and second auxiliary conductors 400-1 and 400-2 are coupled to the first conductive trace pattern 120-1 may further enhance the effect of lowering the resistance and inductance of the signal transmission path.

Figure 6:
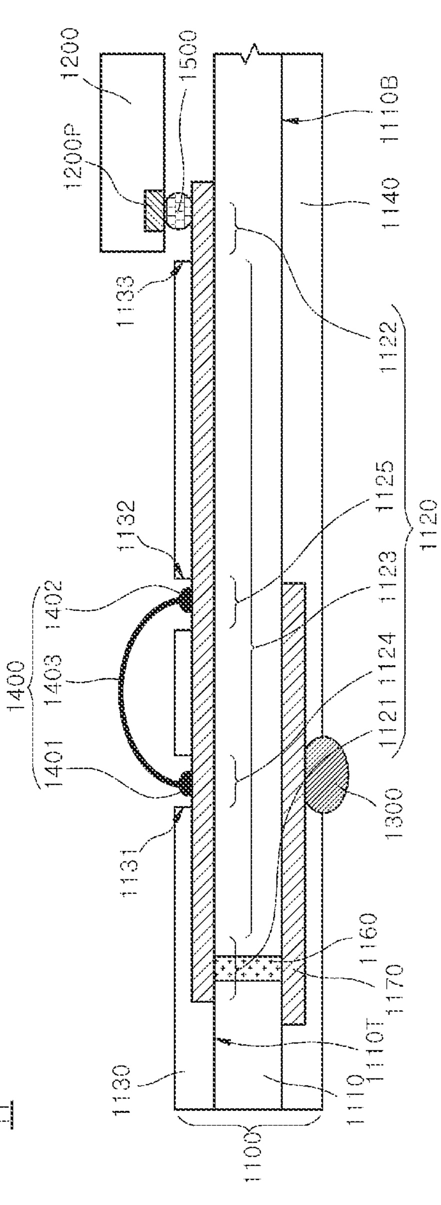
FIG. 6 is a view illustrating a semiconductor package according to an embodiment of the present disclosure.

FIG. 6 is a view illustrating a semiconductor package 11 according to an embodiment of the present disclosure.

Referring to FIG. 6, the semiconductor package 11 may include a semiconductor die 1200 disposed on a package substrate 1100. The package substrate 1100 may include a conductive trace pattern 1120. The package substrate 1100 may include a substrate body 1110, and the conductive trace pattern 1120 may be disposed on a top surface 1110T of the substrate body 1110. The package substrate 1100 may further include a conductive pattern 1170 disposed for a conductive ball to be formed on a bottom surface 1110B, which is on the opposite side of the top surface 1110T of the substrate body 1110. An external connector 1300 may be connected to the conductive pattern 1170. The package substrate 1100 may further include a conductive via 1160. The package substrate 1100 may further include a first dielectric layer 1130 on the top surface 1110T of the substrate body 1110 and a second dielectric layer 1140 on the bottom surface 1110T.

The semiconductor package 11 may further include a first auxiliary conductor 1400 connected to the conductive trace pattern 1120. The first auxiliary conductor 1400 may include a first end portion 1401 and a second end portion 1402 and may include a first extended portion 1403 connecting the first end portion 1401 with the second end portion 1402. The conductive trace pattern 1120 may include a first coupling portion 1124, a second coupling portion 1125, a second extended portion 1123, a third end portion 1122, and a fourth end portion 1121.

The semiconductor package 11 may further include a connecting bump 1500 connecting the third end portion 1122 of the conductive trace pattern 1120 with the semiconductor die 1200. The connecting bump 1500 may be connected to a conductive pad 1200P of the semiconductor die 1200.

The first dielectric layer 1130 of the package substrate 1100 may be a layer providing openings 1131, 1132, and 1133 that open portions of the conductive trace pattern 1120. The first opening 1131 of the first dielectric layer 1130 may be formed to expose the first coupling portion 1124 of the conductive trace pattern 1120. The second opening 1132 of the first dielectric layer 1130 may be formed to expose the second coupling portion 1125 of the conductive trace pattern 1120. The third opening 1133 of the first dielectric layer 1130 may be formed to expose the third end portion 1122 of the conductive trace pattern 1120. The connecting bump 1500 may be coupled to the first end portion 1122 of the conductive trace pattern 1120 through the third opening 1133.

Although not illustrated, the semiconductor package 11 may further include an encapsulation layer covering the package substrate 1100 and encapsulating the semiconductor die 1200. In addition, although one semiconductor die 1200 is depicted in FIG. 6 as being mounted on the package substrate 1100, a plurality of semiconductor dies 1200 may be stacked in multiple layers.

Figure 7:
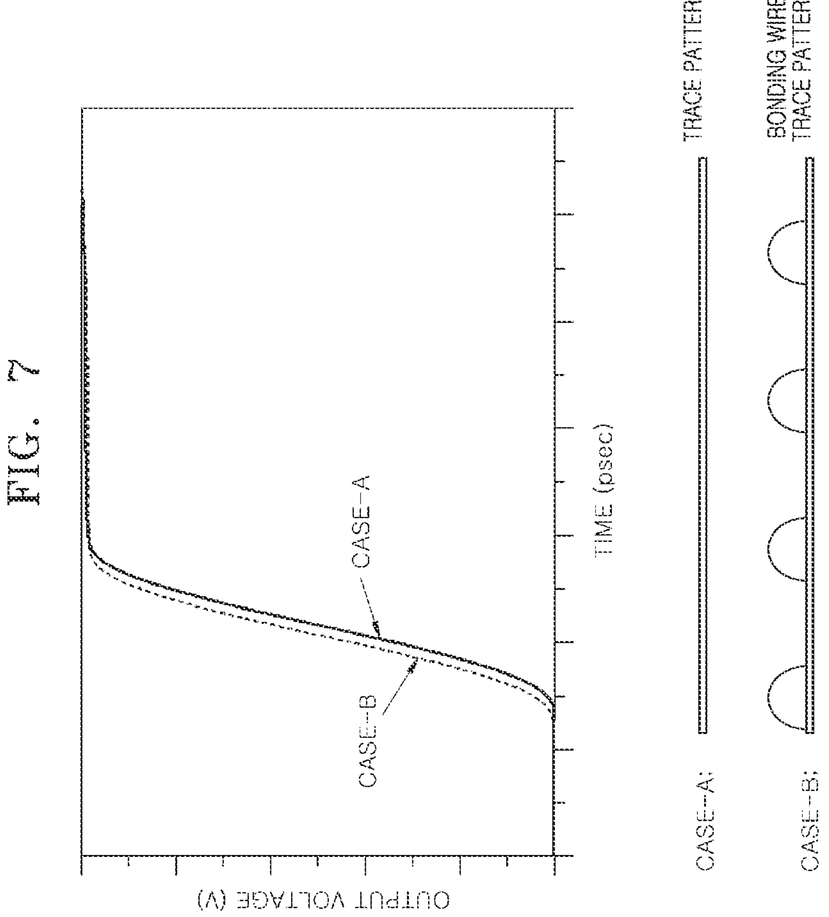
FIGS. 7 to 10 are views illustrating effects of a semiconductor package according to an embodiment of the present disclosure.

FIG. 7 is a view illustrating an effect of reducing a time delay in the semiconductor package according to an embodiment of the present disclosure. FIG. 7 shows simulation results showing a time period in which a voltage is transferred to the opposite end of the conductive trace pattern when the voltage is input to one end of the conductive trace pattern, that is, a time delay. CASE-A is an example in which the conductive trace pattern is formed in a straight line, as shown in FIGS. 2 and 3, and CASE-B is another example in which bonding wires are coupled to the conductive trace pattern as auxiliary conductors. The result of CASE-B shows a reduced time delay than CASE-A.

Figure 8:
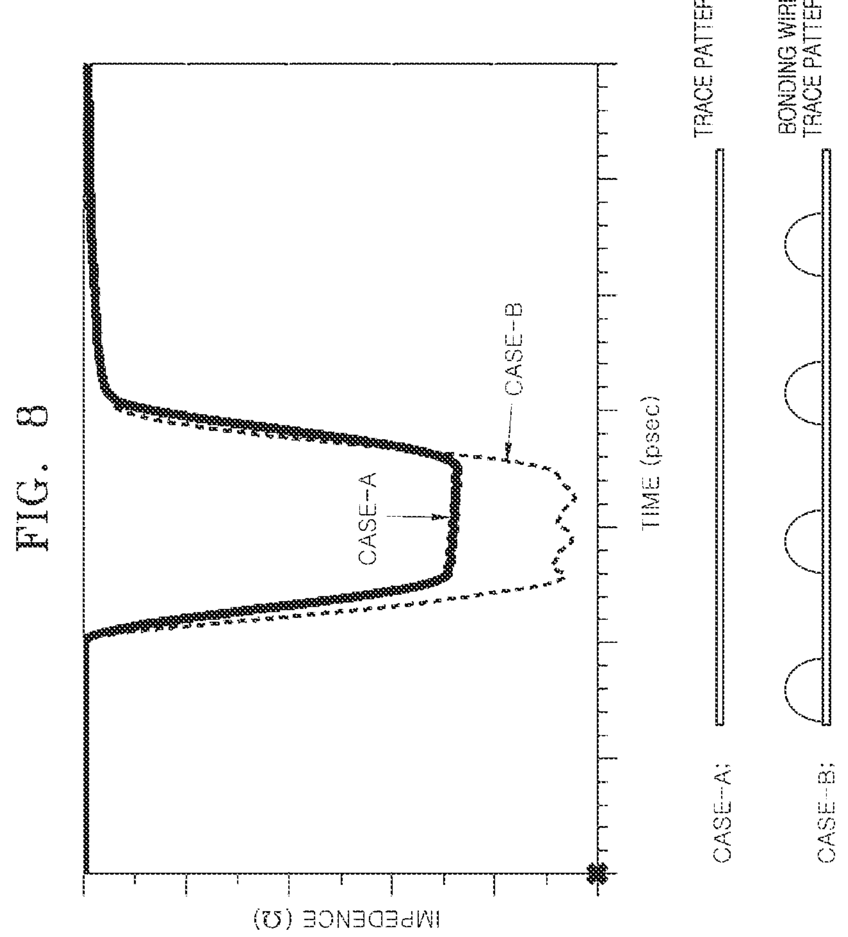

FIG. 8 is a view illustrating an impedance reduction effect in the semiconductor package according to an embodiment of the present disclosure. FIG. 8 shows simulation results showing the size of a reflected waveform when a signal is input to a conductive trace pattern. CASE-A is an example in which the conductive trace pattern is formed in a straight line, and CASE-B is another example in which bonding wires are coupled to the conductive trace pattern as auxiliary conductors. The result of CASE-B shows a reduced impedance than CASE-A.

In the simulation results of FIGS. 7 and 8, it is exemplified that four bonding wires are coupled to the conductive trace pattern, but the effect of the present disclosure is not limited thereto.

Figure 9:
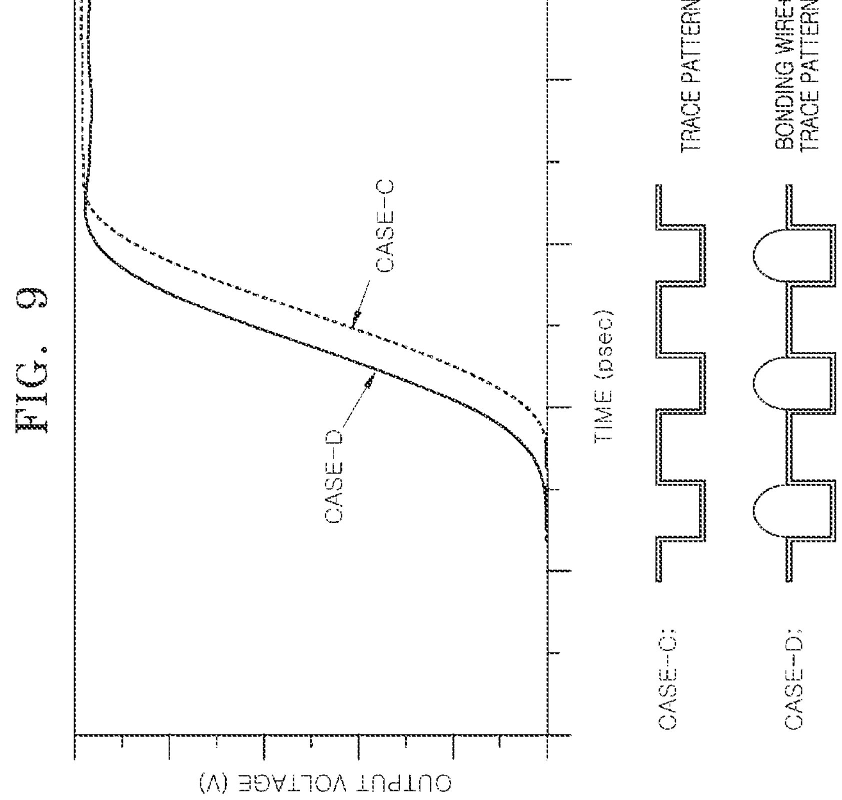

FIG. 9 is a view illustrating an effect of reducing a time delay in the semiconductor package according to an embodiment of the present disclosure. CASE-C is an example in which the conductive trace pattern is formed in a shape including bending portions as shown in FIG. 4. CASE-D is another example in which bonding wires are coupled as auxiliary conductors to the conductive trace pattern. The result of CASE-D shows a reduced time delay than CASE-C.

Figure 10:
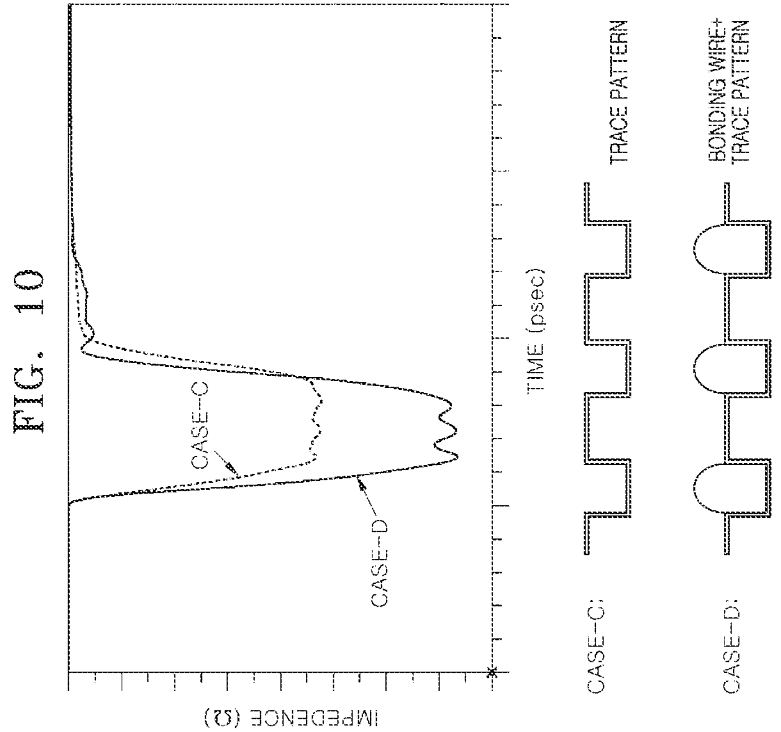

FIG. 10 is a view illustrating an impedance reduction effect in the semiconductor package according to an embodiment of the present disclosure. The result of CASE-D shows a reduced impedance than CASE-C.

In the simulation results of FIGS. 9 and 10, it is exemplified that three bonding wires are coupled to the conductive trace pattern, but the effect of the present disclosure is not limited thereto.

According to the simulation results of FIGS. 7 to 10, the degree of impedance reduction and the degree of time delay reduction may be adjusted by adjusting the number of bonding wires coupled to the conductive trace pattern.

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor package comprising:

a package substrate including a trace pattern;

a semiconductor die disposed over the package substrate; and a first auxiliary conductor including a first end portion and a second end portion coupled to the trace pattern wherein the package substrate further includes a dielectric layer that covers and protects the trace pattern, the dielectric layer including openings for exposing portions of the trace pattern to which the first end portion and the second end portion of the first auxiliary conductor are coupled.

2. The semiconductor package of claim 1, wherein the first auxiliary conductor further includes a first extended portion connecting the first end portion with the second end portion, the first extended portion being spaced apart from the trace pattern.

3. The semiconductor package of claim 1, wherein the first auxiliary conductor is a bonding wire.

4. The semiconductor package of claim 1, further comprising a second auxiliary conductor spaced apart from the first auxiliary conductor and coupled to the trace pattern.

5. The semiconductor package of claim 1, wherein the trace pattern includes:

a third end portion connected to the semiconductor die;

a fourth end portion opposite to the third end portion; and a second extended portion connecting the third end portion with the fourth end portion, and wherein the first end portion and the second end portion of the first auxiliary conductor are respectively coupled to portions of the second extended portion, the portions of the second extended portion being spaced apart from each other.

6. The semiconductor package of claim 5, further comprising a connecting bonding wire connecting the third end portion of the trace pattern to the semiconductor die.

7. The semiconductor package of claim 5, further comprising a connecting bump connecting the third end portion of the trace pattern to the semiconductor die.

8. The semiconductor package of claim 5, wherein the package substrate further includes a conductive via coupled to the fourth end portion of the trace pattern.

9. A semiconductor package comprising:

a package substrate including a trace pattern;

a semiconductor die disposed over the package substrate; and a first auxiliary conductor coupled to the trace pattern, wherein the trace pattern includes a first bending portion and a second bending portion facing each other, and wherein the first auxiliary conductor includes a first end portion and a second end portion respectively coupled to the first bending portion and the second bending portion.

10. The semiconductor package of claim 9, wherein the first auxiliary conductor further includes a first extended portion connecting the first end portion with the second end portion, the first extended portion being spaced apart from the trace pattern.

11. The semiconductor package of claim 9, wherein the first auxiliary conductor has a shape of a bonding wire.

12. The semiconductor package of claim 9, further comprising a second auxiliary conductor spaced apart from the first auxiliary conductor and coupled to the trace pattern.

13. The semiconductor package of claim 9, further comprising a connecting bonding wire connecting the third end portion of the trace pattern to the semiconductor die.

14. The semiconductor package of claim 9, further comprising a connecting bump connecting the third end portion of the trace pattern to the semiconductor die.

15. A semiconductor package comprising:

a package substrate including a trace pattern having bent portions;

a semiconductor die disposed over the package substrate; and a first auxiliary conductor connected to the trace pattern, wherein the first auxiliary conductor bypasses portions of the trace pattern.

16. The semiconductor package of claim 15, wherein the trace pattern includes a first bending portion and a second bending portion mirroring each other along an axis, and wherein the first auxiliary conductor includes:

a first end portion and a second end portion respectively coupled to the first bending portion and the second bending portion, and a first extended portion connecting the first end portion with the second end portion, the first extended portion being spaced apart from the trace pattern.

17. The semiconductor package of claim 15, wherein the first auxiliary conductor has a shape of a bonding wire.

18. The semiconductor package of claim 15, further comprising a second auxiliary conductor spaced apart from the first auxiliary conductor and coupled to the trace pattern.

19. The semiconductor package of claim 15, further comprising a connecting bonding wire connecting an end portion of the trace pattern to the semiconductor die.

20. The semiconductor package of claim 15, further comprising a connecting bump connecting an end portion of the trace pattern to the semiconductor die.

* * * * *